(12) United States Patent
Andre (10) Patent No.: US 6,545,535 B2
(45) Date of Patent: Apr. 8, 2003

(54) METHOD AND APPARATUS FOR REDUCING DISTORTION

(75) Inventor: Tore Andre, Älvsjö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/966,877

(22) Filed: Sep. 28, 2001

(65) Prior Publication Data

US 2002/0060606 A1 May 23, 2002

Related U.S. Application Data (60) Provisional application No. 60/239,815, filed on Oct. 12, 2000.

(51) Int. Cl.[7] .................................................. H03F 1/26
(52) U.S. Cl. ........................ 330/149; 328/163; 375/222
(58) Field of Search ................................ 330/149, 151, 330/52, 136; 328/162, 163; 375/222, 297, 296

(56) References Cited

U.S. PATENT DOCUMENTS

| | | | |
|---|---|---|---|
| 3,641,468 A | | 2/1972 | Hodder .......................... 332/9 |
| 3,825,843 A | * | 7/1974 | Felsberg et al. ............. 328/163 |
| 4,291,277 A | * | 9/1981 | Davis et al. ................. 330/149 |
| 4,453,133 A | | 6/1984 | Travis .......................... 330/149 |
| 5,252,930 A | | 10/1993 | Blauvelt ....................... 330/149 |
| 5,361,156 A | * | 11/1994 | Pidgeon ....................... 359/161 |
| 5,436,749 A | * | 7/1995 | Pidgeon, Jr. et al. ......... 359/161 |
| 5,570,063 A | * | 10/1996 | Eisenberg ................... 330/149 |
| 5,606,286 A | | 2/1997 | Bains .......................... 330/149 |
| 6,271,724 B1 | * | 8/2001 | Neffling ....................... 330/149 |

FOREIGN PATENT DOCUMENTS

| | | |
|---|---|---|
| DE | 196 37 582 A1 | 3/1998 |
| JP | 11154880 A | 6/1999 |

OTHER PUBLICATIONS

Andreoli, Sante et al. "Digital Linearizer for RF Amplifiers". IEEE Transactions on Broadcasting, vol. 43, No. 1, Mar. 1997. pp. 12–19.

Antonio, Franklin et al. "A Novel Adaptive Predistortion Technique for Power Amplifiers". 0–7803–5565–2/99/$10.00@1999 IEEE. pp. 1505–1509.

(List continued on next page.)

Primary Examiner—Brian Young
Assistant Examiner—John Nguyen
(74) Attorney, Agent, or Firm—Jenkens & Gilchrist, P.C.

(57) ABSTRACT

A predistorter, a method for predistorting, and an amplifier include a predistorter. The predistorter is particularly suitable for predistorting an input signal of an amplifier, which amplifier introduces frequency dependent distortion that increase with the frequency. The predistorter makes use of a predistortion technique involving a high pass filter such that distortion, which compensates for the distortion introduced by the amplifier, is introduced in an output signal of the predistorter for the specific frequencies for which further distortion compensation is required. An advantage is that the predistorter allows the performance of an amplifier to be improved by reducing distortion and increasing linearity. Thereby the predistorter allows low power amplifiers with relaxed distortion requirements to be used as, for example, line drivers in many telecommunications systems.

25 Claims, 9 Drawing Sheets

OTHER PUBLICATIONS

D'Andrea, Aldo N. "RF Power Amplifier Linearization Through Amplitude and Phase Predistortion". IEEE Transactions on Communications, vol. 44, No. 11, Nov. 1996. pp. 1477–1484.

de Mingo, Jesús et al. "Performance of a Digital Base–Band Predistorting Amplifier Linearizer Implemented in Fixed Point DSPs". 0–7803–3879–0/98/$10.00. pp. 522–526.

Jeckeln, Ernesto G. et al. "Linearization of Microwave Emitters using an Adaptive Digital Predistorter". pp. 336–340.

Kang, Hyun Woo et al. "On Compensating Nonlinear Distortions of an OFDM System Using an Efficient Adaptive Predistorter". IEEE Transactions on Communication, vol. 47, No. 4, Apr. 1999. pp. 522–526.

Kappes, Michael S. "A 3–V CMOS Low–Distortion Class AB Line Driver Suitable for HDSL Applications". IEEE Journal of Solid–State Circuits, vol. 35, No. 3, Mar. 2000. pp. 371–376.

Li, Ying et al. "Data Predistortion with Adaptive Fuzzy Systems". 0–7803–5731–0/99/$10.00@1999 IEEE. pp. VI–168 –VI–172.

Morris, Kevin et al. "Power Amplifier Linearisation Using Predistortion Techniques". The Institution of Electrical Engineers, 1997. pp. 6/1 –6/6.

* cited by examiner fig. 1 fig. 2 fig. 3 fig. 4 fig. 5 fig. 6 fig. 7 fig. 8 fig. 9 fig. 10 fig. 11 fig. 12 fig. 13 fig. 14 fig. 15 fig. 16 fig. 17

METHOD AND APPARATUS FOR REDUCING DISTORTION

CROSS REFERENCE TO RELATED APPLICATIONS

This application for patent claims the benefit of priority from and incorporates by reference the entire disclosure of co-pending U.S. Provisional Application No. 60/239,815, which was filed on Oct. 12, 2000.

FIELD OF THE INVENTION

The present invention relates to reduction of distortion caused by an amplifier in general and in particular to linearisation, by means of adaptive predistortion, of an amplifier which gives rise to distortion that varies within the range of frequencies in which the amplifier works.

BACKGROUND

Distortion is an undesirable change in a signal that may arise for instance when the signal is amplified by an amplifier with some kind of non-linearity that distorts the signal. Non-linearity in an amplifier can particularly become a problem when the amplifier is set to work close to its maximum voltage.

Distortion can cause the signal to be misinterpreted. A system that is particularly sensitive to distortion is a multi-carrier telecommunications system. In a multicarrier system information is transmitted on a common medium in channels separated by the assignment of a portion of the available frequency spectrum to each individual channel. Harmonics caused by distortion may often appear outside the working bandwidth of a system and can thus easily be disregarded or removed by filtering. Harmonics caused by distortion in a multicarrier system are often difficult to detect and compensate for since a harmonic to one channel may interfere with another channel. Multicarrier systems therefore require highly linear amplifiers. Imperfections in the linearity of an amplifier can however be improved using a number of different techniques, such as for instance feedback, feedforward and predistortion.

Another type of system that is particularly sensitive to distortion is a telecommunications system with echo cancellation. Echo cancellation makes use of a linear filter to cancel echo and this filter will not be able to cancel the echo if it includes distortion.

With feedback linearisation a portion of the output of the amplifier is returned and subtracted from the input. This reduces gain and distortion and increases linearity.

Feedforward linearisation is possible when the actual distortion caused by the amplifier is known or can somehow be extracted or measured. It is then possible to combine the output of the amplifier with a signal that cancels the distortion in the amplified signal.

With predistortion linearisation, distortion is intentionally added to the input of the amplifier in such a way that the added distortion effectively cancels the distortion generated by the amplifier itself. There are many available predistortion techniques to choose from.

The U.S. Pat. No. 5,606,286 describes a predistortion technique in which a radio frequency signal is divided in three different parts which are exposed to different amounts of distortion and then recombined to form a single predistortion signal.

In the U.S. Pat. No. 4,453,133 predistortion components are developed by an amplifying device similar to a power amplifier, the linearity of which it is desirable to improve.

An adaptive predistorter created from a Wiener system model of an HPA (high power amplifier) and a filter is shown in Hyun Woo Kang et al, "On Compensating Non-linear Distortion of an OFDM System Using an Efficient Adaptive Predistorter", IEEE Transactions on Communications, Vol. 47, No.4, pp. 522–526; April 1999.

Digital predistortion techniques using look-up tables (LUT) are described in E. Jeckeln, F. Ghannouchi and M. Sawan, "Linearization of Microwave Emitters using an Adaptive Digital Predistorter" and in J. de Mingo, A. Valdovinos and J. Ruiz, "Performance of a Digital Base-band Predistorting Amplifier Linearizer Implemented in Fixed Point DSPs".

A linedriver is an amplifier that is used in digital subscriber line (DSL) telecommunications transceivers to drive electrical signals onto a telecommunications line. Non-linear distortion in the linedriver is a common limiting factor of the performance of the transceiver. The linedriver in an ADSL-system may be required to work at frequencies in the range of 0 Hz–1 MHz, which means that the linedriver, in addition to high linearity, is required to have a bandwidth that is in the same order of magnitude as its working frequency. It is further desirable to limit the power consumption in the linedriver. However it is hard to achieve both low power consumption and wide bandwidth for an amplifier. In addition the non-linearity of an amplifier tend to increase the closer to saturation the amplifier has to work. In view of linearity it is thus desirable to have an amplifier with high power consumption working far below saturation as a linedriver, while in view of power efficiency it is desirable to have an amplifier with low power consumption working close to saturation.

Typically a phase compensated amplifier with feedback is used as a linedriver in xDSL-systems. Phase compensation is a method to ensure stability in the amplifier. An amplifier with phase compensation shows high open loop gain for low frequencies but the gain decreases proportionally to the frequency. Feedback will, as mentioned above, reduce gain and distortion and increase linearity. It is possible to attenuate distortion satisfactorily at low frequencies by means of the feedback, but due to the fact that the open loop gain decreases proportionally to the frequency the effect of the feedback on distortion will also decrease with the frequency. A phase compensated amplifier with feedback will thus show distortion that depends on and increases with the frequency.

SUMMARY OF THE INVENTION

The present invention solves the problem of effectively attenuating distortion introduced by an amplifier, which distortion is characterised in that it depends on and increases with the frequency. As mentioned above one type of amplifiers that introduce frequency dependent distortion is a phase compensated linedriver with feedback. The invention thus solves the problem of reducing distortion introduced by said type of linedriver or by an amplifier with similar distortion characteristics. Several prior art techniques for increasing linearity and reducing distortion caused by amplifiers have been mentioned above. None of these prior art techniques are however suitable or specially adapted for dealing with frequency dependent distortion. Frequency dependent distortion usually only becomes a problem when the required bandwidth of the amplifier is in the same order of magnitude as its working frequency. The range of the frequency spectrum that the amplifier has to cover can then be said to be wide compared to the frequencies of the signals to be amplified. When s aid range is narrow compared to the order of frequencies of the signals to be amplified the distortion usually has substantially the same order of magnitude within the entire range. This is usually the case in radio frequency (RF) applications. A RF amplifier works at high frequencies but covers a comparably small range of the frequency spectra. For most RF application it is therefore not necessary to take frequency dependency of the distortion in consideration.

An object of the present invention is to provide a predistorter for predistorting an input signal of an amplifier, which amplifier introduces frequency dependent distortion as mentioned above.

Another object of the present invention is to provide a method for predistorting an input signal of an amplifier, which amplifier introduces frequency dependent distortion as mentioned above.

A further object of the present invention is to provide an amplifier with high linearity which amplifier includes a predistorter that reduces frequency dependent distortion in the amplifier's output.

The present invention solves the above stated problem by means of a predistortion technique involving high pass filtering such that the distortion compensation from predistortion is set to work for the specific frequencies for which further distortion compensation is required.

According to one aspect of the invention the above stated problem is solved by means of a predistorter for predistorting an input signal of an amplifier, which predistorter produces an output signal based on a combination of a first signal component and a second signal component, which first signal component is linearly dependent on an input signal to the predistorter and which second signal component depends on a high pass filtered non-linearity dependent on the input signal to the predistorter.

According to another aspect of the invention the above stated problem is solved by means of a method for predistorting an input signal of an amplifier, which method includes the steps of producing a first signal component based on an input signal to the predistorter, producing a second signal component by high pass filtering a non-linearity dependent on the input signal to the predistorter and combining the signal components to a predistorted input signal of the amplifier.

An advantage with the present invention is that it allows the performance of an amplifier to be improved by reducing distortion and increasing linearity.

Another advantage is that the invention allows low power amplifiers with relaxed distortion requirements to be used as for example linedrivers in many telecommunications systems. In systems where the invention allows a more power consuming high quality amplifier to be replaced by a cheaper amplifier with less power consumption costs can be reduced.

Yet another advantage of the present invention is that it is fairly simple. It does not require complex calculations to be performed.

A further advantage of an embodiment of the present invention is that the inventive predistortion can adapt to changes over time in the characteristics of the amplifier.

The present invention will now be described in more detail by means of preferred embodiments and with reference to the accompanying drawings.

DETAILED DESCRIPTION

As mentioned above the present invention is particularly suitable for reducing the type of distortion introduced by a phase compensated amplifier with feedback. Such an amplifier is often used as a linedriver in for instance an ADSL-system. The characteristics of a typical ADSL-linedriver will now be discussed in order to give a better understanding of the background of the invention.

Figure 1:
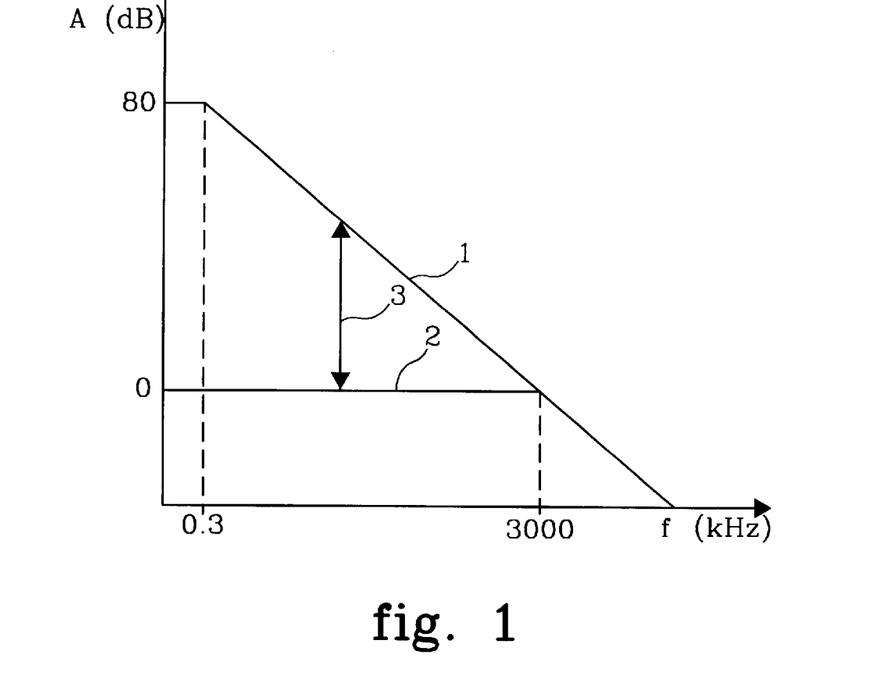
FIG. 1 is a schematic diagram of a frequency response of an amplifier.

FIG. 1 shows a schematic diagram of the frequency response of the linedriver. The open loop gain, line 1, is large for low frequencies f. At 300 Hz the open loop gain starts to drop with the frequency due to the phase compensation. Phase compensation ensures stability of the linedriver by guaranteeing a gain below 1 for −180° phase shift. If the amplification A is more than 0 dB for −180° phase shift the linedriver may start to oscillate. The phase shift will increase as the frequency increases so by means of reducing the gain as the frequency increases a gain below 1, i.e. below 0 dB, can be guaranteed when the phase shift reaches −180°. In this example the phase compensation works to give an open loop gain, line 1, that drops 6 dB per octave and that is below 0 dB for frequencies over 3000 kHz. When in use in the ADSL-system it is probably desirable to have a considerably lower total gain than the maximum open loop gain (80 dB in this example) and it is desirable to have a constant total gain in the entire frequency spectra of interest. If the signal in to the linedriver is strong a total gain of 0 dB may be satisfactory. The desirable total gain is achieved by means of feedback. The resulting total gain with feedback, line 2, is shown in FIG. 1. The effect of the feedback is indicated with arrows 3 in FIG. 1. The feedback will bring the total gain with feedback 2 to the desired 0 dB for those frequencies for which the open loop gain is more than 0 dB. However, the feedback can not provide a total gain over the open loop gain, so for frequencies over 3000 kHz, for which the open loop gain is below 0 dB, the total gain with feedback and the open loop gain will be equal. In addition to achieving the desirable level of total gain the feedback increases linearity and attenuates distortion. The attenuation of distortion is proportional to the difference between the open loop gain and the total gain with feedback. This means that the attenuation of distortion decreases as the frequency increases. It is therefore possible that the feedback is unable to achieve satisfactory attenuation of distortion for frequencies above a certain limit, thus necessitating the use of a complementary tool for attenuating distortion above this frequency limit. The present invention provides such a complementary tool. The present invention is however not limited only to linedrivers or to phase compensated amplifiers with feedback. The invention is e.g. suitable for use in combination with other types of amplifiers showing similar open loop characteristics as shown in FIG. 1.

Figure 2:
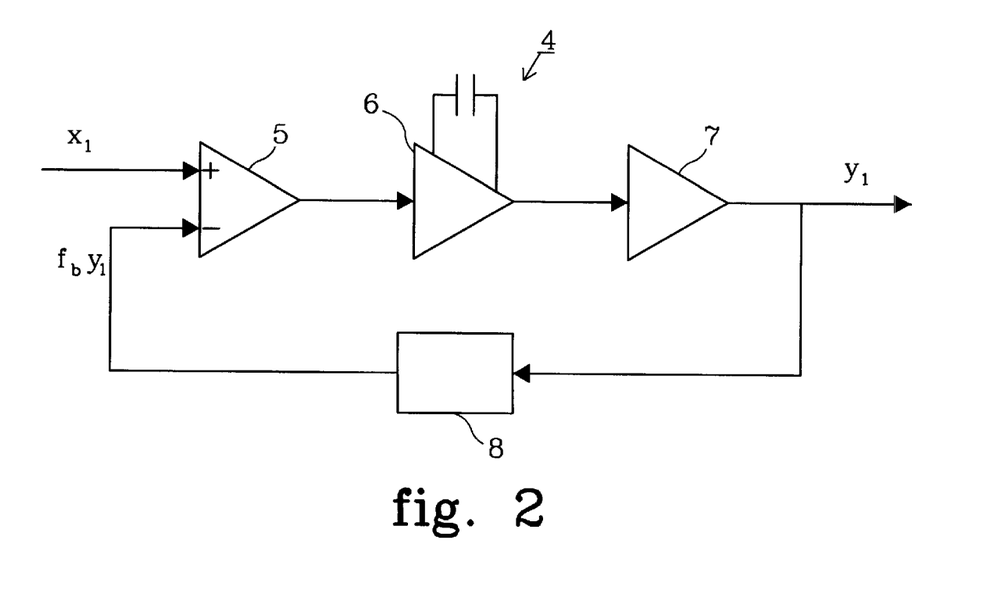
FIG. 2 is a schematic block diagram of a model of a linedriver.

FIG. 2 shows a simplified model 4 of the linedriver discussed above. The model comprises a differential stage 5, a gain stage with phase compensation 6 and a driver stage 7. The feedback 8 is also represented in the model. In the differential stage 5 is a feedback signal $f_b y_1$ subtracted from an input signal $x_1$. The gain stage with phase compensation 6 amplifies the difference between the input signal $x_1$ and the feedback signal $f_b y_1$. The amplification is very large for frequencies below a certain limit, in this case 300 Hz, but decreases for frequencies above this limit. The driver stage 7 should model the part of the linedriver that drives a telecommunications signal $y_1$ onto a telecommunications line. It is often fair to assume that the distortion introduced by the linedriver mainly is generated in the driver stage 7. The driver stage will thus be modelled as a non-linear function. This model of the linedriver will be of use when designing a predistorter according to the invention. However, before describing the special variant of predistortion that the invention involves, predistortion in general will be explained.

Figure 3:
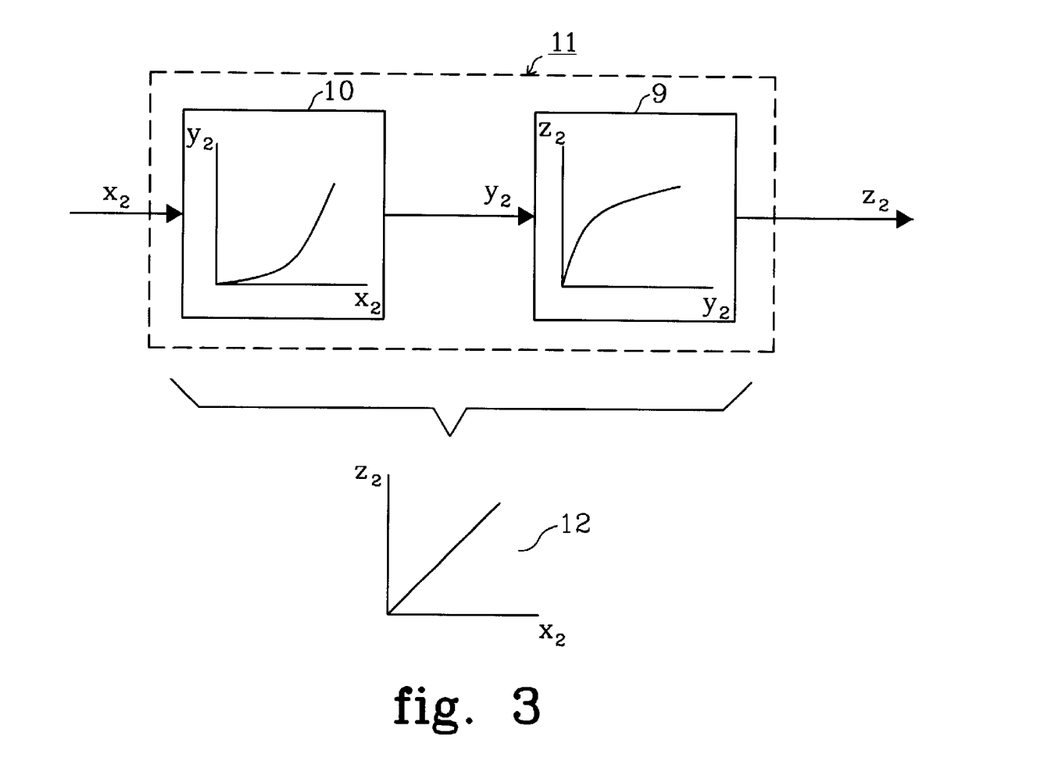
FIG. 3 is a schematic diagram illustrating the principle of predistortion.

The idea of predistortion is illustrated in FIG. 3. An amplifier 9 shows non-linear transfer characteristics. Predistortion in its simplest form involves the use of a predistorter 10, which has the inverse transfer characteristics of the amplifier 9. By letting the predistorter 10 and the amplifier 9 form a system 11 for which an output $y_2$ of the predistorter is the input of the amplifier, linearity is obtained for the whole system. A graph 12 illustrates that an output $z_2$ of the system 11 is a linear function of an input $x_2$ to the system. In practice it is seldom possible to accomplish a perfect inverse to the non-linearity of the amplifier. Different methods of approximation are then used to obtain a predistorter that at least increases linearity, even if it can not achieve a completely linear system.

The properties of an amplifier will in reality often change over time. The amplifier's properties might be affected by factors such as ageing or changes in the properties of the amplifier's surroundings. If the dynamics of the amplifier change, the effect of the predistorter, used in combination with the amplifier, might deteriorate. In order to prevent this adaptive predistortion may be used. Adaptive predistortion involves the use of an adaptive predistorter, which has the ability to adapt its predistortion to changes in the amplifier. It may also be advantageous to use an adaptive predistorter if the predistorter is designed for a particular type of amplifier but the individual amplifiers of this type show variations in characteristics. The adaptive predistorter can then adapt to the characteristics of the individual amplifier that it is connected to.

Figure 4:
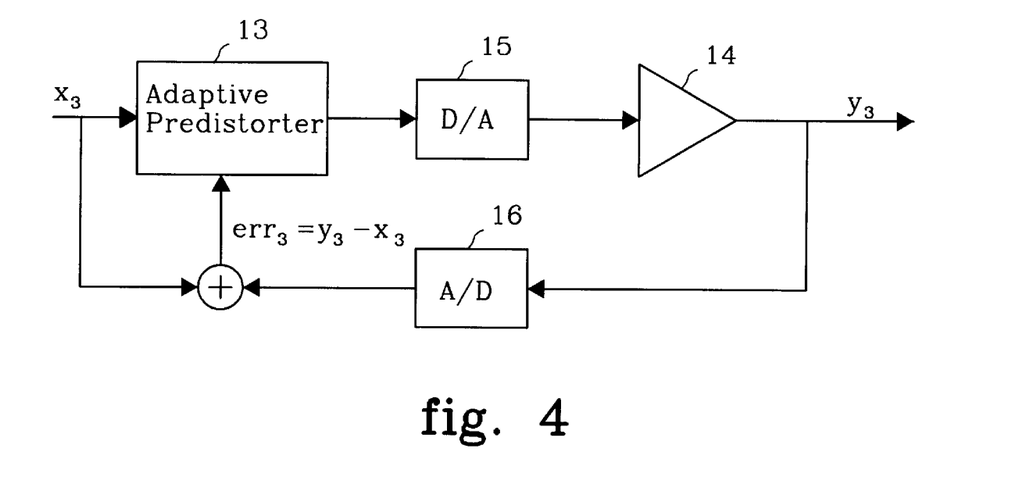
FIG. 4 is a schematic block diagram illustrating adaptive predistortion.

FIG. 4 shows the use of a digital adaptive predistorter 13 in combination with a linedriver 14. Since the predistorter 13 is digital and the linedriver 14 in analogue, a D/A-converter 15 and an A/D-converter 16 must be used to connect them. The adaptive predistorter 13 has a first input $x_3$ and a second input $err_3$. The first input $x_3$ is the telecommunications signal that the linedriver 14 should drive onto a telecommunications line. The second input $err_3$ is an error signal which depends on the input signal $x_3$ and an output signal $y_3$ from the amplifier. The error signal can for instance be the difference between the output signal $y_3$ and the input signal $x_3$. The error signal $err_3$ gives the adaptive predistorter information regarding the effect on the output of the predistortion and makes it possible to adjust the predistortion to achieve less distortion in the output $y_3$.

Figure 5:
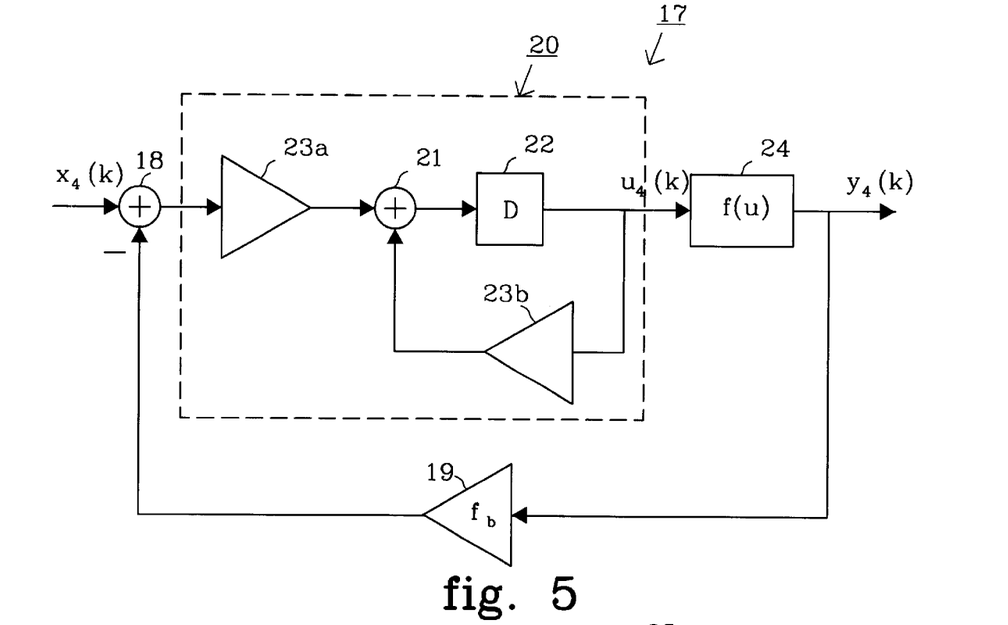
FIG. 5 is a schematic block diagram of a discrete-time model of a linedriver.

As mentioned above the invention provides a predistorter suitable for use with amplifiers giving rise to frequency dependent distortion. To use a true inverse of the non-linearity of the amplifier as a predistorter is not possible for such amplifiers due to the frequency dependency of the distortion. An inventive predistorter and an inventive method for predistortion can be obtained by making use of knowledge about the linedriver model 4 shown in FIG. 2. The idea is to create an inverse of this model and design a predistorter based on this inverse. If a digital predistorter is to be built the start must be a discrete-time model of the linedriver 4. Such a discrete-time model 17 is illustrated in FIG. 5. The discrete-time model has an input $x_4(k)$, which can be obtained from sampling a continuous-time signal, and an output signal $y_4(k)$. k is used herein to denote association with a sample k. The combiner 18 represents the differential stage 5. The feedback is modelled as a multiplication block 19 that multiplies the output signal $y_4(k)$ with the factor $-f_b$ and brings the result to be combined with the input signal $x_4(k)$ in the combiner 18. The output of the combiner, i.e. $x_4(k)-f_b y_4(k)$, is forwarded to a phase compensation block 20, which is a model of the phase compensation of the linedriver. The phase compensation block includes a combiner 21, a delay block 22, and two multiplication blocks 23a and 23b, which together form a digital filter. The delay block 22 gives a delay of one sample. The multiplication block 23a has a coefficient $\alpha$ and the multiplication block 23b has a coefficient $\beta$. The coefficient $\beta$ is a number that is a little bit less than 1, but can in many cases be approximated as equal to 1. The driver stage 7 is modelled by means of a non-linear function f(u) in a block 24, where variable u denotes dependency on an input $u_4(k)$ to the block 24. Using z-transforms the discrete-time model 17 can be expressed in equation-form as $$Y_4(z) = f\left(\alpha \cdot \frac{X_4(z) - f_b Y_4(z)}{z - \beta}\right), \quad (e1)$$

where $X_4(z)$ and $Y_4(z)$ denotes the z-transforms of the input signal $x_4$ (k) and the output signal $y_4(k)$ respectively.

The inverse model to the discrete-time model 17 can be obtained if the non-linear function f(u) has an inverse function g(u) so that u=f(g(u)). Using the equation (e1) it is then possible to express $X_4(z)$ as a function of the inverse function g(u), i.e.

$$X_4(z) = \frac{g(u)}{\alpha} \cdot (z - \beta) + f_b \cdot Y_4(z) \quad (e2)$$

In order to obtain a causal system equation (e2) is multiplied by $z^{-1}$; i.e. a delay is introduced;

$$z^{-1} X_4(z) = \frac{g(u)}{\alpha} \cdot (1 - \beta z^{-1}) + f_b \cdot z^{-1} Y_4(z). \quad (e3)$$

In order to continue to let x denote input signals and y output signals, $X_4(z)$ is replaced by $Y_5(z)$ and $Y_4(z)$ is replaced by $X_5(z)$ in equation (e3), resulting in $$z^{-1}Y_5(z) = \frac{g(u)}{\alpha} \cdot (1 - \beta z^{-1}) + f_b \cdot z^{-1} X_5(z) \qquad (e4)$$

Figure 6:
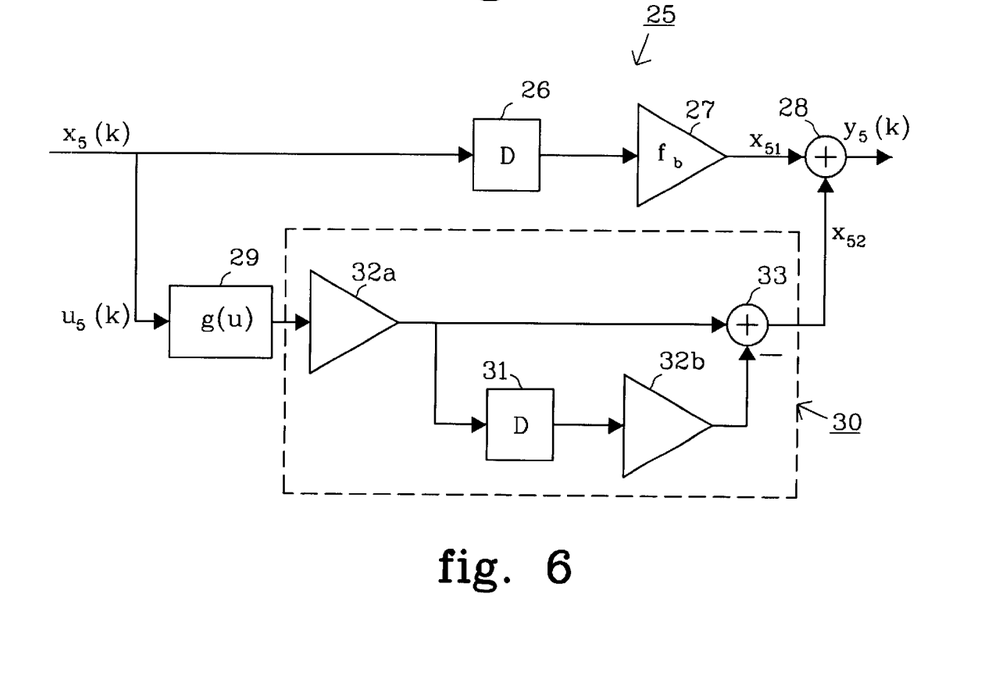
FIG. 6 is a schematic block diagram of an embodiment of an inventive digital predistorter.

The inverse model 25 corresponding to expression (e4) is illustrated in FIG. 6. The inverse model 25 is also a functional model of an embodiment of a predistorter 25 according to the present invention. The predistorter comprises a delay block 26, a multiplication block 27 with the coefficient $f_b$, a combiner 28, a block 29 including the non-linear function g(u), and a high pass filter 30. The high pass filter 30 comprises a delay block 31, a multiplication block 32a with the coefficient $1/\alpha$, a multiplication block 32b with the coefficient $\beta$, and a combiner 33. The input signal to the predistorter is denoted by $x_5(k)$ and the output signal is denoted by $y_5(k)$. An input to block 29 is denoted by $u_5$ (k), which here is equal to the input signal $x_5$ (k). The output $y_5$ (k) of the predistorter 25 is the result of a combination of a first signal component $x_{51}$, which is the delayed input signal, and a second signal component $x_{52}$, which is a high pass filtered non-linearity dependent on the input signal. The first signal component is thus free of distortion while the second signal component includes distortion which is intended to cancel distortion introduced by an amplifier with which the predistorter 25 is used. Since the second signal is high pass filtered, in this case by a first order high pass filter, the output signal will only include noticeable distortion above a certain frequency limit. The predistorter 25 is thereby suitable for use with amplifiers, such as the linedriver discussed above, for which distortion only becomes a problem above a certain frequency level.

Suitable values for the coefficients $\alpha$ and $\beta$ may vary depending on the amplifier that the predistorter is to be connected to. The non-linear function g(u), which should model the inverse of the non-linearity of the amplifier, must also be chosen based on knowledge about the non-linearity of the amplifier. Suitable choices of function g(u) may thus vary depending on the type of amplifier used.

Figure 7:
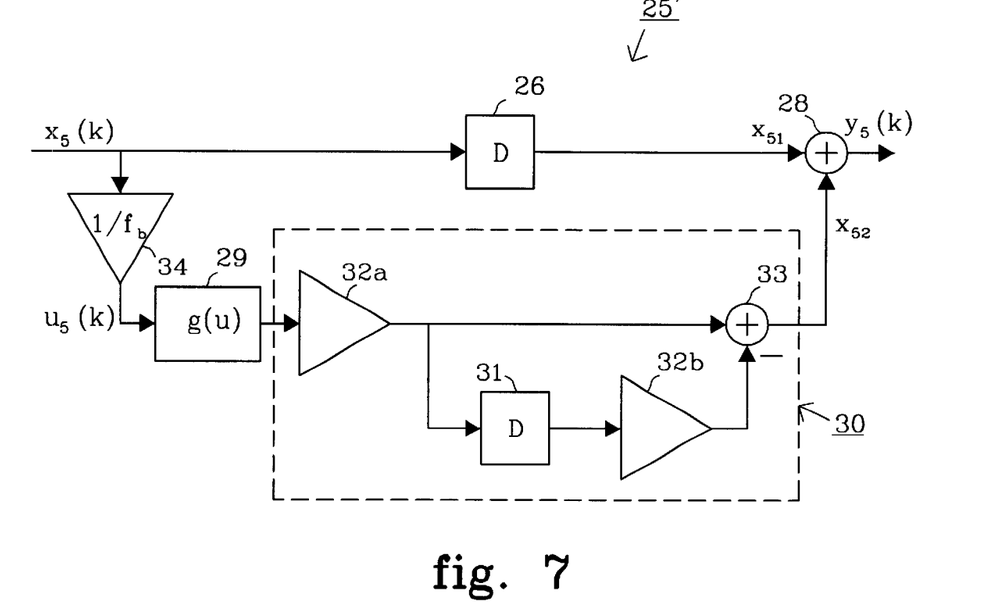
FIG. 7 is a schematic block diagram of another embodiment of an inventive digital predistorter.

The predistorter 25 in FIG. 6 is built to give a total gain of 0 dB when used with an amplifier and is thus built to cancel gain effects from the feedback. In order to obtain a predistorter 25' that does not affect the total gain, the input signal $x_5(k)$ in FIG. 6 may be multiplied with the factor $1/f_b$. The resulting model of the predistorter 25' is shown in FIG. 7. The predistorter 25' is identical to the predistorter 25 in FIG. 6, apart from the addition of a multiplication block 34 with the coefficient $1/f_b$ and apart from the absence of the multiplication block 27. The same figures are used in FIG. 6 and FIG. 7 to denote equivalent elements so the elements in FIG. 7 with an equivalent element in FIG. 6 is not explained further.

Figure 8:
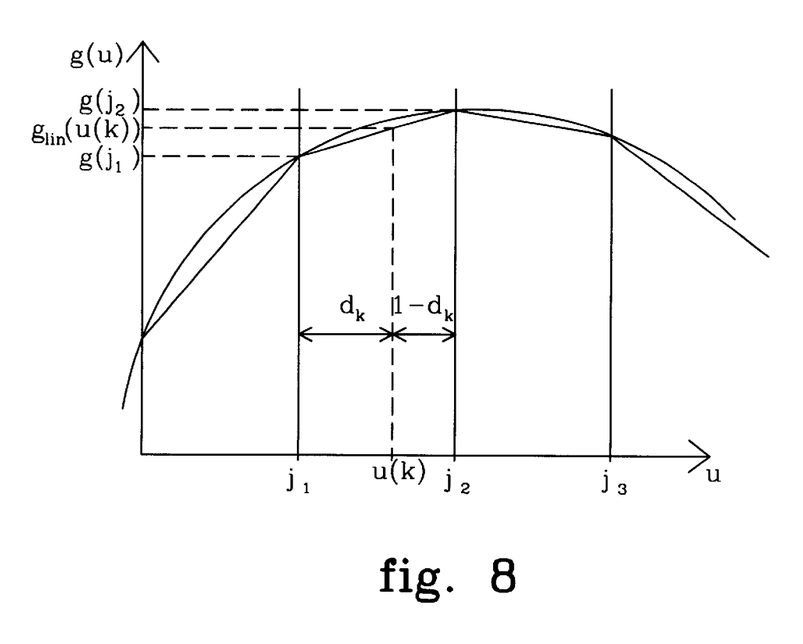
FIG. 8 is a schematic diagram illustrating piecewise linearisation of a non-linearity.

It may be useful to represent the non-linear function g(u), discussed above, with a piecewise linear approximation $g_{lin}(u)$. Such a linear approximation can be obtained by dividing the range of the input u into a set of segments with end values $j_1, j_2, j_3$ etc. as shown in FIG. 8. A straight line is then used to approximate function g(u) in each segment. As an example the approximation $g_{lin}(u)$ can be determined as $$g_{lin}(u(k)) = g(j_n) + d_k \cdot (g(j_{n+1}) - g(j_n)) \qquad (e5)$$

where $j_n$ denotes the end value of a segment nearest below signal u at a particular sample k and $d_k = u(k) - j_n$. There are many other ways than the one presented above for obtaining a piecewise linear approximation of function g(u). A realisation of the predistorter 25 that uses the linear approximation of the function g(u) has the advantage that only a few values representing the function g(u), viz. the $g(j_n)$-values, have to be stored.

A person skilled in the art appreciates that the non-linear function g(u) can be represented by many other types of approximations other than the linear approximation described above. Other types of approximations may e.g. be based on polynomials such as spline-functions.

As mentioned above it is often advantageous to use an adaptive predistorter. The inventive predistorters 25 and 25' shown in FIG. 6 and FIG. 7 can be made adaptive by letting the function g(u) be adaptive. In the case where the linear approximation of the function g(u) described above is used, adaptation of the approximation $g_{lin}(u)$ can be obtained by updating the values $g(j_n)$ and $g(j_{n+1})$ according to $$g(j_n) = g(j_n) + m \cdot err(k) \cdot (1 - d_{k-v}) \qquad (e6)$$

$$g(j_{n+1}) = g(j_{n+1}) + m \cdot err(k) \cdot d_{k-v}, \qquad (e7)$$

where m is a small constant number and $err(k) = y_{ld}(k) - x_5(k-v)$ is an error signal. $y_{ld}$ is the output from the amplifier, in this example the linedriver, that the predistorter is connected to. Since the linedriver is analogue and the predistorter digital in this case, the output of the linedriver must be converted to digital. v denotes the total number of samples delay that the predistorter and the linedriver introduce. Due to delays in the predistorter and in the linedriver, the output of the linedriver at a particular sample k is a reaction on the input to the predistorter v samples earlier. It is therefore important to use a delayed version of the input signal $x_5(k)$ (here $u(k) = x_5(k)$) in equation (e6) and equation (e7) above. $(1 - d_{k-v})$ and $d_{k-v}$ in equations (e6) and (e7) are weights that affect how much the values $g(j_n)$ and $g(j_{n+1})$ respectively are changed based on the error signal err(k). If the value $j_n$ is closer to the signal $u(k-v)$ than the value $j_{n+1}$, then the value $g(j_n)$ changes more than the value $g(j_{n+1})$ because the weight $(1 - d_{k-v})$ is larger than the weight $d_{k-v}$. If on the other hand the value $j_{n+1}$, is closer to the signal $u(k-v)$ than the value $j_n$, then the weight $d_{k-v}$ becomes larger than the weight $(1 - d_{k-v})$ which leads to the value $g(j_{n+1})$ changing more than the value $g(j_n)$.

Figure 9:
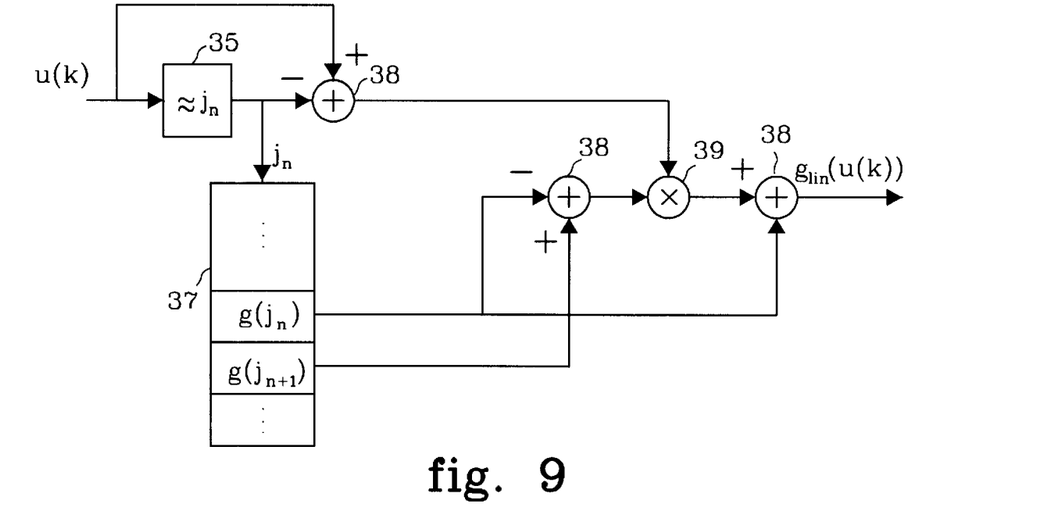
FIG. 9 is a schematic block diagram illustrating calculation of a piecewise linear approximation of a non-linear function.
Figure 10:
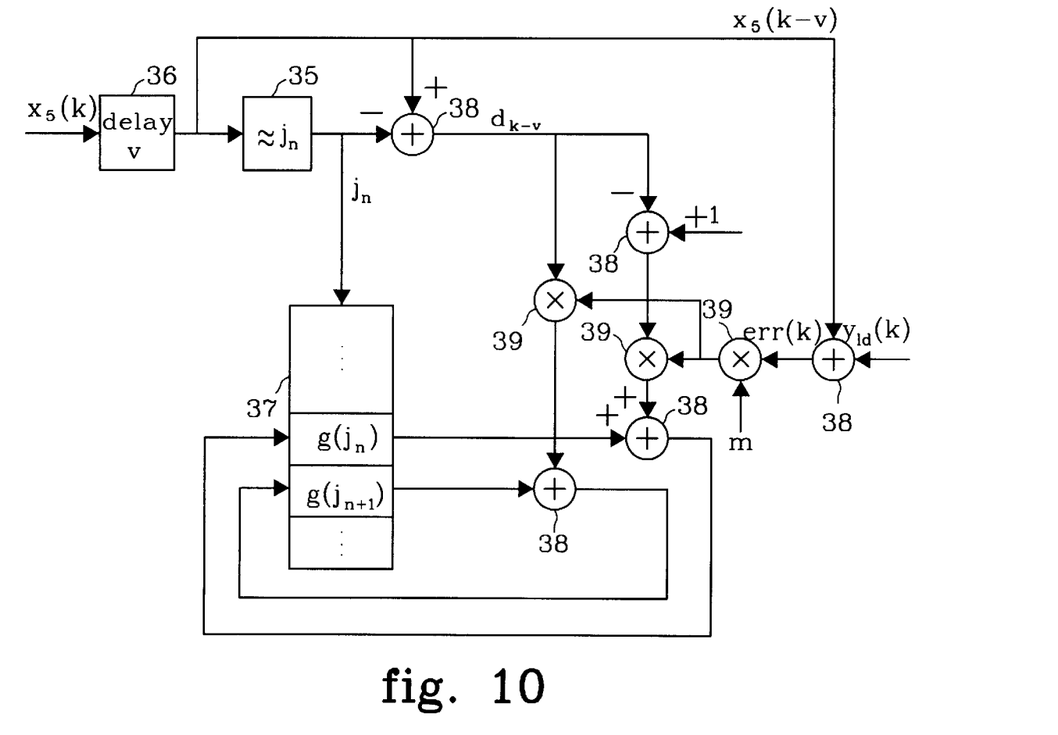
FIG. 10 is a schematic block diagram illustrating adaptation of the piecewise linear approximation of FIG. 9.

The process of computing the approximation $g_{lin}(u)$ is illustrated in FIG. 9 and the process of adapting the approximation $g_{lin}(u)$ is illustrated in FIG. 10. In FIG. 9 and FIG. 10 is the reference numeral 37 used to denote a table in which the $g(j_n)$-values are stored and the reference numeral 38 is used to denote adders and the reference numeral 39 is used to denote multipliers. A truncation block 35 indicates the rounding off of u(k) to the closest lower value $j_n$ and a delay block 36 indicates delaying the input signal $x_5(k)$ with the delay v samples.

An advantage with adaptation of the function g(u) is that it is not necessary to find a function that is a good representation of the inverse to the non-linearity of the amplifier when designing the predistorter. Thanks to the adaptation the predistorter will adjust to the amplifier when it is in use so even with a poor representation of the function g(u) to start with the predistorter will improve the representation with time.

It is not necessary to adapt the function g(u) for each sample k. Adaptation can be made more seldom for instance for every third sample. It is also possible to use adaptation only at an initial stage in order to tune the predistorter to a particular amplifier and then turn the adaptation off. An advantage with continuos adaptation throughout the use of the predistorter is however that the predistorter is able to adapt to changes in the amplifiers characteristics with time.

For the adaptation described above it was necessary to perform digital conversion of the output of the linedriver. It is possible that a transceiver, in which the linedriver is comprised, does not include a dedicated A/D-converter to perform this conversion. If it is not desirable to introduce such a dedicated A/D-converter it might be possible to use an A/D-converter that already is present in the transceiver and normally is used on a receiving side for converting received telecommunications traffic. It is however only possible to make use of this already present A/D-converter for adaptation when it is not used for converting the received telecommunications traffic. But in a case where it is only desirable to use adaptation initially to tune the predistorter to the linedriver, the already present A/D-converter may be used for set-up before using the transceiver for reception of telecommunications traffic. If a dedicated A/D-converter is used adaptation can be made continuously. The dedicated A/D-converter does not have to be very fast if adaptation is not made for every sample but it has to have high linearity.

Figure 11:
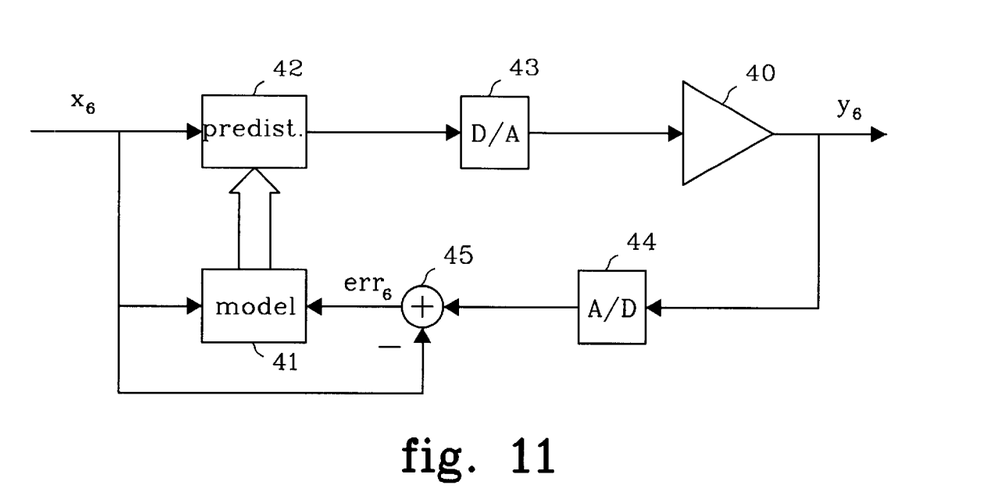
FIG. 11 is a schematic block diagram illustrating an embodiment of adaptive predistortion according to the present invention.

It has been described above how adaptive predistortion can be achieved by means of letting g(u), in the inventive predistorter 25, 25', be adaptive. It was also shown how the inventive predistorter 25, 25' could be derived from the linedriver model 17. Another alternative of obtaining adaptive predistortion is shown in FIG. 11. FIG. 11 shows adaptive predistortion of a linedriver 40 wherein an adaptive model 41 of the linedriver is used. An inverse 42 to the adaptive model 41 is then created and used as predistorter. In this case the adaptive model 41 and the inverse 42 are digital while the linedriver is analogue so a D/A-converter 43 and an A/D converter 44 must be used. An input signal $x_6$ is the input signal to both the adaptive model 41 and the inverse 42. The inverse 42 has an additional input $err_6$, which is dependent on an output $y_6$ of the linedriver and the input $x_6$ and which is created in a combination block 45. An adaptive model 41 can be based on an adaptive version of the linedriver model 17. The linedriver model 17 can be made adaptive for instance by means of updating f(u) in an analogous way as was described for g(u) above. Since in this case f(u) is updated and not the inverse of f(u) it is necessary to compute the inverse from f(u) to create the predistorter 42. In the case when g(u) was adapted it was not necessary to compute the inverse to the non-linearity of the amplifier since it was enough to have some representation of g(u) to start with and then let the predistorter adapt with time.

All the embodiments of the present invention described above have been digital. However it is possible to create analogue versions of the digital embodiments described.

Figure 12:
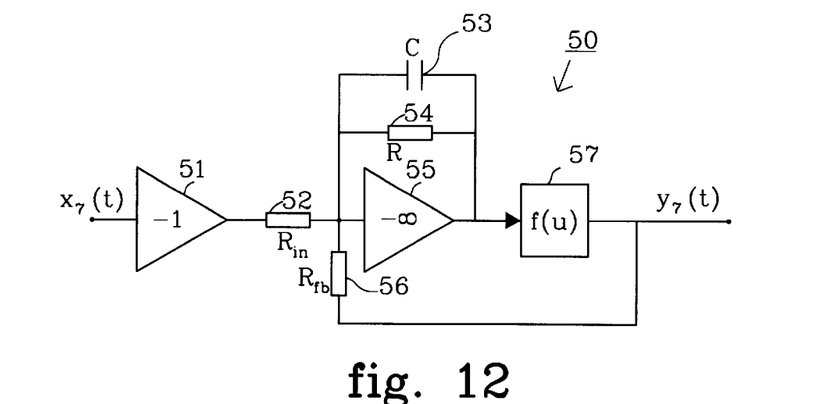
FIG. 12 is a schematic block diagram of an analogue model of a linedriver.

An analogue linedriver model 50, which is an analogue version of the linedriver model 17, is shown in FIG. 12. The linedriver model 50 includes an inverting amplifier 51, a resistor 52 with resistance $R_{in}$, a capacitor 53 with capacitance C, a resistor 54 with resistance R, an infinite gain amplifier 55, a resistor 56 with resistance $R_{fb}$ and a block 57 with the non-linear function f(u), which as in the linedriver model 17 models the non-linearity of the linedriver. The linedriver model 50 has a continuous input signal $x_7(t)$ and a continuous output signal $y_7(t)$. Analogue predistorters may be derived from the analogue linedriver model 50.

Figure 13:
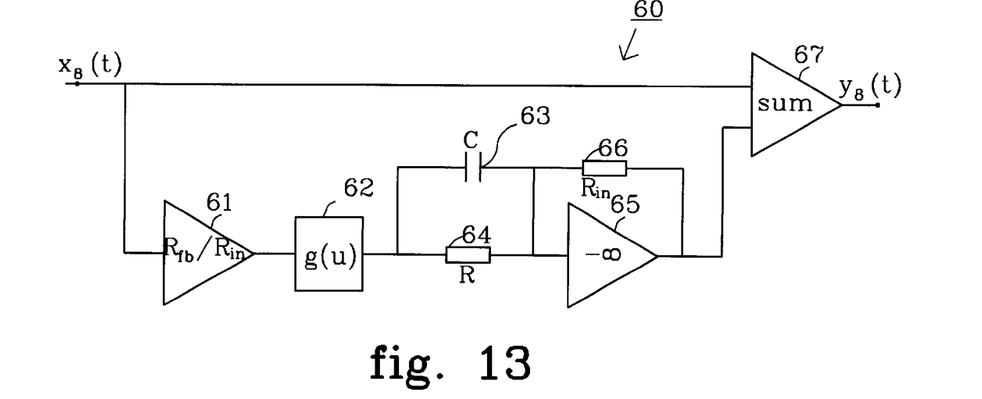
FIG. 13 is a schematic block diagram of an embodiment of an analogue predistorter according to the present invention.

An analogue predistorter 60, corresponding to the digital predistorter 25', is shown in FIG. 13. The predistorter 60 includes an amplifier 61 with gain $R_{fb}/R_{in}$, a block 62 including the non-linear function g(u), a capacitor 63 with capacitance C, a resistor 64 with resistance R, an infinite gain amplifier 65, a resistor 66 with resistance $R_{in}$ and a summing amplifier 67. The predistorter has a continuous input $x_8(t)$ and a continuous output $y_8(t)$. The non-linear function g(u) in block 62 may be represented as a digital function, in which case it is necessary to introduce A/D-and D/A-converters around block 62.

FIGS. 14*a*–*d* show how the amplifiers in FIGS. 12 and 13 can be implemented using operational amplifiers and electrical components.

Figure 14:
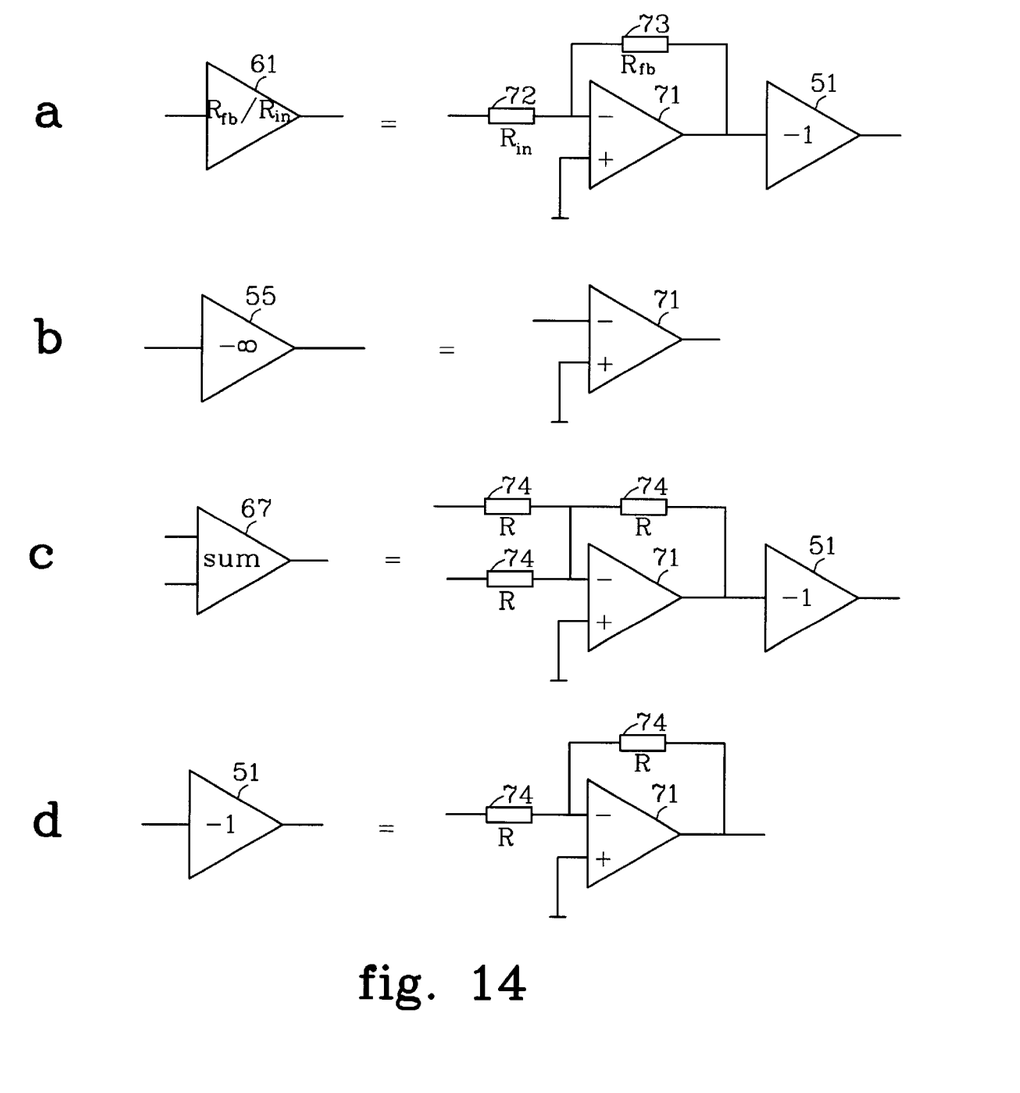
FIGS. 14a–d are schematic circuit diagrams illustrating implementations of amplifiers shown in FIG. 12 and FIG. 13.

FIG. 14*a* shows how the amplifier 61 in FIG. 13 can be implemented by means of an operational amplifier 71, an inverting amplifier 51 and two resistors, 72, 73 with resistance $R_{in}$ and $R_{fb}$.

FIG. 14*b* shows how the infinite gain amplifiers 55, 65 in FIG. 12 and FIG. 13 can be implemented by means of an operational amplifier 71.

FIG. 14*c* shows how the summing amplifier 67 in FIG. 13 can be implemented by means of an operational amplifier 71, an inverting amplifier 51 and three resistors 74 with resistance R.

FIG. 14*d* shows how the inverting amplifier 51 can be implemented by means of an operational amplifier 71 and two resistors 74 with resistance R.

Figure 15:
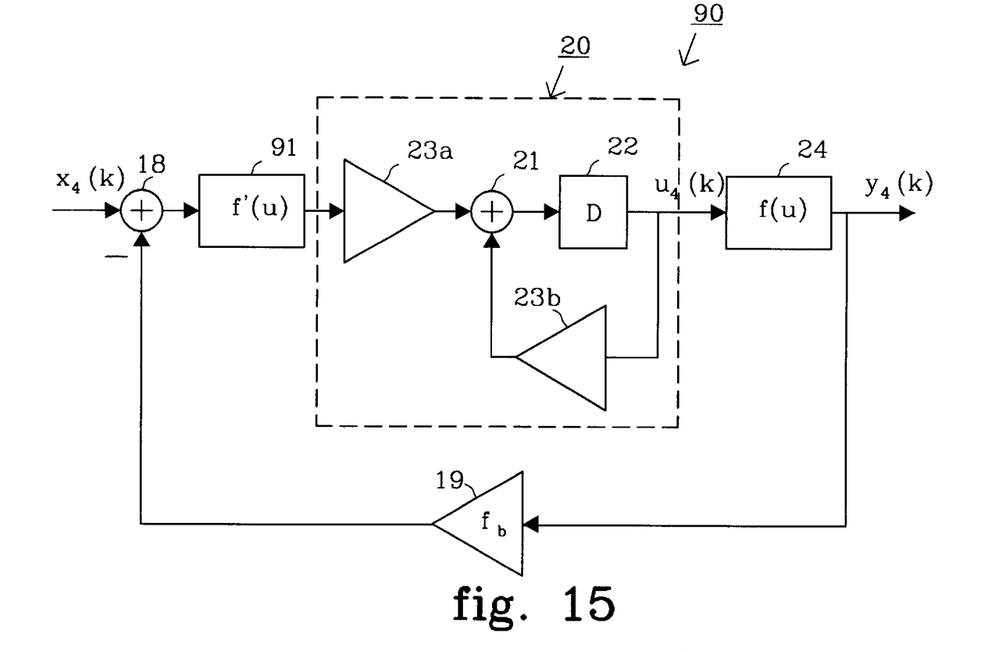
FIG. 15 is a schematic block diagram of an alternative discrete-time model of the linedriver.

In the description above of the linedriver model of FIG. 2 it was mentioned that it is often fair to assume that the distortion introduced by the linedriver mainly is generated in the driver stage 7. In some cases however it is in addition necessary to consider distortion generated in the differential stage 5. If it is assumed that non-linearities are introduced in the differential stage as well as in the driver stage, a discrete-time model 90 of the linedriver can be designed as shown in FIG. 15. The discrete-time model 90 is similar to the discrete-time model 17 shown in FIG. 5, so like reference numerals in FIG. 15 designate parts corresponding to like parts in FIG. 5. The model 90 differs from the model 17 in that it includes a block 91 with a non-linear function f'(u), which models the non-linearity, generated in the differential stage.

Figure 16:
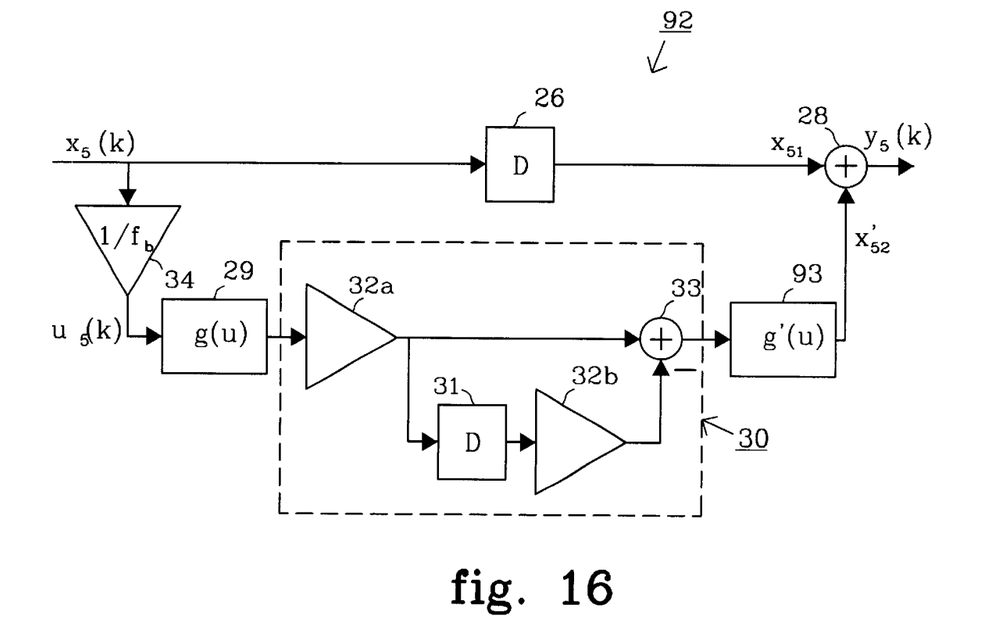
FIG. 16 is a schematic block diagram of an alternative embodiment of an inventive digital predistorter.

FIG. 16 shows a digital predistorter 92, which is based on an inverse to the discrete-time model 90. The predistorter 92 is similar to the predistorter 25' shown in FIG. 7, so like reference numerals in FIG. 16 designate parts corresponding to like parts in FIG. 7 and these parts are therefore not explained further. The predistorter 92 differs from the predistorter 25' in that it includes a block 93 with a non-linear function g'(u), which is the inverse of the non-linear function f'(u). The first signal component $x_{51}$ created by the predistorter 92 is identical to the first signal component $x_{51}$ created by the predistorter 25', but the predistorter 92 combines the first signal component with a second signal component $x'_{52}$, which differ from the second signal component $x_{52}$ created by the predistorter 25'. The second signal component $x'_{52}$ is a non-linearity dependent on a high-pass filtered non-linearity. The characteristics of the second signal component $x'_{52}$ makes the predistorter 92 particularly suitable for use in combination with linedrivers for which it is not possible to disregard the impact of distortion generated in the differential stage of the linedriver.

It is apparent to a person skilled in the art that the inventive predistorters described above can be realised in many different ways. The inventive digital predistorter can be realised in hardware with means of digital circuits or as software in a signal processing circuit. The inventive analogue predistorter can be realised by means of operational amplifiers and analogue circuits.

Figure 17:
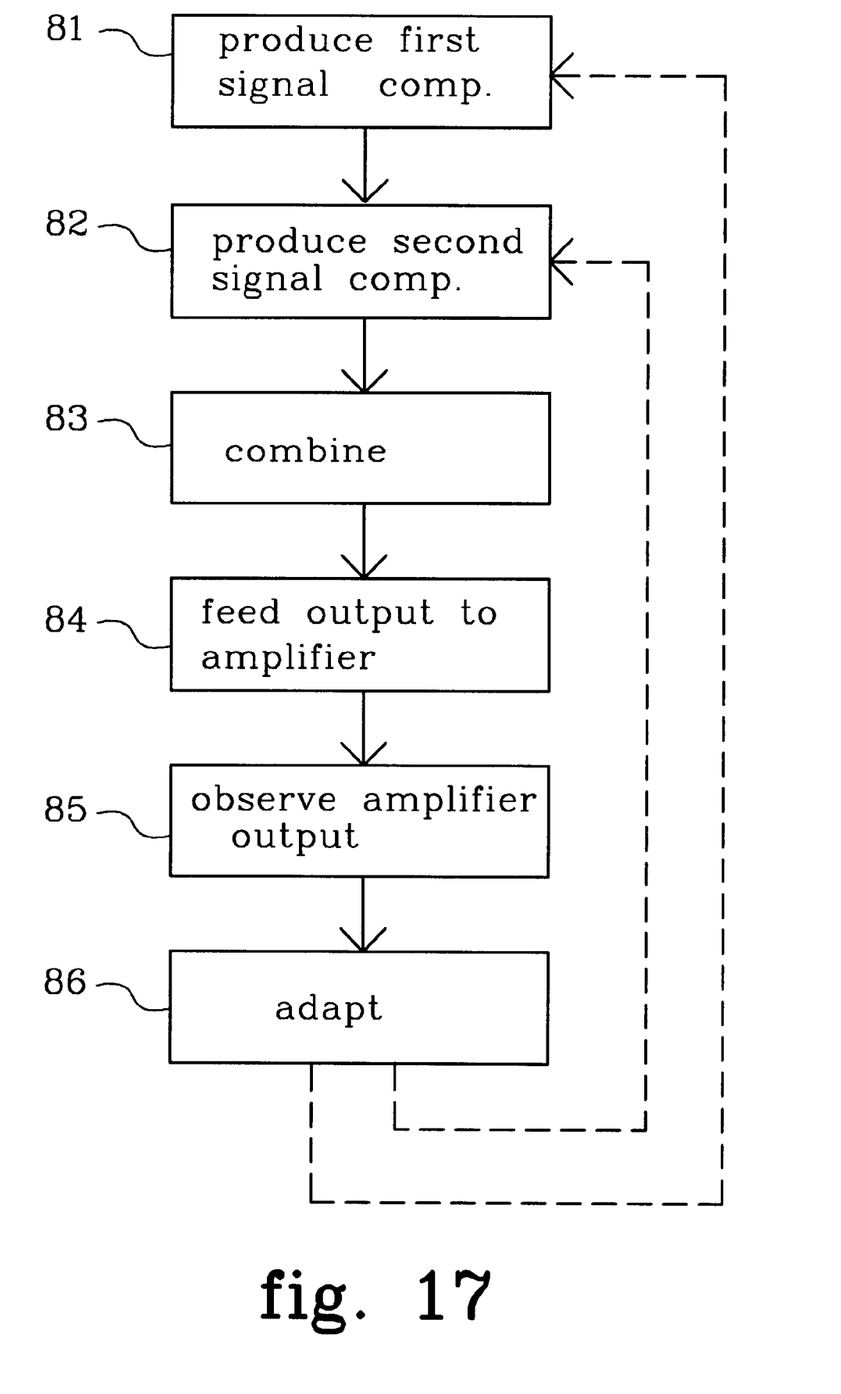
FIG. 17 is a flow diagram of an inventive method for predistortion.

Inventive methods for predistortion have become apparent from the descriptions of the inventive predistorters described above. FIG. 17 shows a flow diagram of such an inventive method of predistortion. The method includes a step 81 wherein a first signal component is produced based on an input signal. In some cases the input signal must be delayed.

In a step 82 a second signal component is produced by means of high pass filtering a non-linear function of the input signal. In some cases, as shown in FIG. 16, the second signal component is created from a second non-linear function that depends on the high pass filtered non-linear function. The first and second signal components are combined in a step 83 to form an output signal which can be fed, step 84, as a predistorted input signal to an amplifier with frequency dependent distortion. In the case of adaptive predistortion an error signal is created based on an output from the amplifier, step 85. The error signal is then used to adapt the predistortion, step 86, which may affect one or both of the steps 81 and 82 in which the first and second signal components are produced.

What is claimed is:

1. A predistorter for predistorting an amplifier input signal of an amplifier, which predistorter has a predistorter input signal and an output signal, wherein the predistorter includes means for adding distortion to said predistorter input signal such that said output signal includes a first distortion, which first distortion is arranged to compensate for a second distortion introduced by said amplifier when said output signal serves as said amplifier input signal of said amplifier, and wherein said means for adding distortion includes means for producing a first signal component, which first signal component is linearly dependent on said predistorter input signal;

means for producing a second signal component, which second signal component is dependent on a high pass filtered non-linearity dependent on said predistorter input signal; and means for combining said first signal component and said second signal component to form said output signal.

2. The predistorter according to claim 1, wherein said means for producing said second signal component includes means for making said second signal component non-linear based on a first non-linear function dependent on said predistorter input signal, which first non-linear function is the inverse of a second non-linear function, which second non-linear function is an approximation of a non-linearity of said amplifier.

3. The predistorter according to claim 1, wherein said means for producing said second signal component includes means for making said second signal component non-linear based on a piecewise linear approximation of a first non-linear function dependent on said predistorter input signal, which first non-linear function is the inverse of a second non-linear function, which second non-linear function is an approximation of a non-linearity of said amplifier.

4. The predistorter according to claim 3, wherein said piecewise linear approximation is adaptive such that it can be updated based on an error signal, which error signal depends on said predistorter input signal and on an amplifier output signal from said amplifier.

5. The predistorter according to claim 4, wherein said piecewise linear approximation is based on a set of first values, wherein each first value is associated with a second value within the range of values of the predistorter input signal;

wherein a first chosen value and a second chosen value from said set of first values are updated by means of a first correction term and a second correction term respectively each time said piecewise linear approximation is updated; and wherein said first correction term is larger than said second correction term, when said second value associated with said first chosen value is closer to the value of the predistorter input signal at a predetermined moment than said second value associated with said second chosen value.

6. The predistorter according to claim 2, wherein said means for producing said second signal component includes second means for making said second signal component non-linear based on a third non-linear function dependent on a high pass filtered output of said first non-linear function, which third non-linear function is the inverse of a fourth non-linear function, which fourth non-linear function is an approximation of a second non-linearity of said amplifier.

7. The predistorter according to claim 3, wherein said means for producing said second signal component includes second means for making said second signal component non-linear based on a piecewise linear approximation of a third non-linear function dependent on a high pass filtered output of said first non-linear function, which third non-linear function is the inverse of a fourth non-linear function, which fourth non-linear function is an approximation of a second non-linearity of said amplifier.

8. The predistorter according to claim 1, wherein said means for producing said second signal component includes a first order high pass filter.

9. The predistorter according to claim 1, wherein said second distortion, which said first distortion is particularly arranged to compensate for, is a frequency dependent distortion introduced by a phase compensated amplifier with feedback.

10. The predistorter according to claim 1, wherein the predistorter is the inverse model of an adaptive model of the amplifier.

11. The predistorter according to claim 1, wherein said means for producing said first signal component includes delaying means for delaying said first signal component with a predetermined delay value.

12. The predistorter according to claim 1, wherein the predistorter is digital.

13. The predistorter according to claim 1, wherein the predistorter is analogue.

14. An amplifier including a predistorter according to claim 1.

15. The amplifier according to claim 14, wherein the amplifier is a linedriver.

16. A method for predistorting an amplifier input signal of an amplifier, which method includes a step of producing an output signal based on a predistorter input signal, such that said output signal includes distortion;

a step of arranging said distortion to compensate for distortion introduced by said amplifier when said output signal is fed to said amplifier as said amplifier input signal of said amplifier;

a step of producing a first signal component, which first signal component is linearly dependent on said predistorter input signal;

a step of producing a second signal component, which second signal component is dependent on a high pass filtered non-linearity dependent on said predistorter input signal; and a step of combining said first signal component and said second signal component to form said output signal.

17. The method according to claim 16, wherein said method includes a step of making said second signal component non-linear based on a first non-linear function dependent on said predistorter input signal, which first non-linear function is the inverse of a second non-linear function, which second non-linear function is an approximation of a non-linearity of said amplifier.

18. The method according to claim 16, wherein said method includes a step of making said second signal component non-linear based on a piecewise linear approximation of a first non-linear function dependent on said predistorter input signal, which first non-linear function is the inverse of a second non-linear function, which second non-linear function is an approximation of a non-linearity of said amplifier.

19. The method according to claim 18, wherein said method includes a step of adapting said piecewise linear approximation, which step of adapting involves updating said piecewise linear approximation based on an error signal, which error signal depends on said predistorter input signal and on an amplifier output signal from said amplifier.

20. The method according to claim 19, wherein said piecewise linear approximation is based on a set of first values, wherein each first value is associated with a second value within the range of values of the predistorter input signal;

wherein said updating of said piecewise linear approximation involves updating a first chosen value and a second chosen value from said set of first values by means of a first correction term and a second correction term respectively; and wherein said first correction term is larger than said second correction term, when said second value associated with said first chosen value is closer to the value of the predistorter input signal at a predetermined moment than said second value associated with said second chosen value.

21. The method according to claim 17, wherein said method includes a second step of making said second signal component non-linear based on a third non-linear function dependent on a high pass filtered output of said first non-linear function, which third non-linear function is the inverse of a fourth non-linear function, which fourth non-linear function is an approximation of a second non-linearity of said amplifier.

22. The method according to claim 18, wherein said method includes a second step of making said second signal component non-linear based on a piecewise linear approximation of a third non-linear function dependent on a high pass filtered output of said first non-linear function, which third non-linear function is the inverse of a fourth non-linear function, which fourth non-linear function is an approximation of a second non-linearity of said amplifier.

23. The method according to claim 16, wherein said step of producing said second signal component involves signal filtering through a first order high pass filter.

24. The method according to claim 16, wherein the method further includes a step of feeding said output signal to said amplifier as said predistorter input signal of said amplifier and wherein said amplifier is a phase compensated amplifier with feedback.

25. The method according to claim 16, wherein said method includes a step of delaying said first signal component with a predetermined delay value.

* * * * *